(12) United States Patent
Beer et al.

(10) Patent No.: US 10,070,544 B2
(45) Date of Patent: Sep. 4, 2018

(54) ARRANGEMENT FOR COMPENSATING PRESSURE IN A HOUSING

(71) Applicants: CONTI TEMIC MICROELECTRONIC GMBH, Nuremberg (DE); HONDA MOTOR CO., LTD., Tokyo (JP)

(72) Inventors: Stefan Beer, Laaber (DE); Radu Bobitan, Timisoara (RO); Cristian Dragos, Timisoara (RO); Kenji Morizumi, Tochigi-ken (JP); Takahiro Ikeda, Saitama-ken (JP)

(73) Assignees: Conti Temic microelectronic GmbH, Nuremberg (DE); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 14/651,328

(22) PCT Filed: Nov. 4, 2013

(86) PCT No.: PCT/DE2013/200269
§ 371 (c)(1),
(2) Date: Jun. 11, 2015

(87) PCT Pub. No.: WO2014/090235
PCT Pub. Date: Jun. 19, 2014

(65) Prior Publication Data
US 2015/0334863 A1    Nov. 19, 2015

(30) Foreign Application Priority Data

Dec. 11, 2012 (DE) .................. 10 2012 112 098

(51) Int. Cl.
*B60K 15/03* (2006.01)
*H05K 5/02* (2006.01)
(Continued)

(52) U.S. Cl.
CPC ........ *H05K 5/0213* (2013.01); *H05K 5/0004* (2013.01); *H05K 5/068* (2013.01)

(58) Field of Classification Search
CPC ........... B60K 15/035; Y10T 137/86332; Y10T 137/8634; H05K 5/06; H05K 5/00; H05K 5/068; H05K 5/0004; H05K 5/0213
(Continued)

(56) References Cited

U.S. PATENT DOCUMENTS 6,486,398 B1 * 11/2002 McCulloch ......... B60R 16/0222
174/539
6,506,110 B1    1/2003 Borisch
(Continued)

FOREIGN PATENT DOCUMENTS

CN    1989794 A    6/2007
CN    101795900 A    8/2010
(Continued)

*Primary Examiner* — Stephen Castellano
(74) *Attorney, Agent, or Firm* — Laurence A. Greenberg; Werner H. Stemer; Ralph E. Locher

(57) ABSTRACT

A configuration compensates for the pressure in a housing, in which at least one housing wall has a pressure compensation opening which is sealed with a semi-permeable membrane. The membrane is fixed, at least in a material fit to the housing wall and is covered by a protective element. Accordingly, the housing wall has, in the region of the pressure compensation opening, an indentation and/or recess for receiving the membrane. The respective periphery thereof corresponds to a periphery of the membrane and the height thereof corresponds at least to the thickness of the membrane.

9 Claims, 4 Drawing Sheets

(51) Int. Cl.
*H05K 5/00* (2006.01)
*H05K 5/06* (2006.01)

(58) Field of Classification Search
USPC .................. 220/746, 89.1, 745; 361/679.01; 174/522, 17.06
See application file for complete search history.

(56) References Cited

U.S. PATENT DOCUMENTS

| | | |
|---|---|---|
| 7,626,129 B2 | 12/2009 | Sasaki et al. |
| 8,727,844 B2 | 5/2014 | Furuyama et al. |
| 2010/0079021 A1 | 4/2010 | Lorin |
| 2012/0114902 A1 | 5/2012 | Furuyama et al. |

FOREIGN PATENT DOCUMENTS

| | | | |
|---|---|---|---|
| CN | 102803022 A | | 11/2012 |
| DE | 3248715 A1 | | 7/1984 |
| DE | 19708116 A1 | | 9/1998 |
| DE | 102006053115 A1 | * | 5/2008 |
| DE | 102006053115 A1 | | 5/2008 |
| FR | 2854023 A1 | | 10/2004 |
| GB | 2330952 A | | 5/1999 |
| JP | 2001168543 A | | 6/2001 |
| JP | 2001525619 A | | 12/2001 |
| JP | 2008055981 A | | 3/2008 |
| WO | 9929150 A1 | | 6/1999 |
| WO | WO-2006/011496 A1 | * | 2/2006 |
| WO | WO-2009/031628 A1 | * | 12/2009 |
| WO | WO-2010/143437 A1 | * | 12/2010 |

* cited by examiner

ARRANGEMENT FOR COMPENSATING PRESSURE IN A HOUSING

This application is the national stage (Rule 371) of international application No. PCT/DE2013/200269 filed Nov. 4, 2013.

BACKGROUND OF THE INVENTION

Field of the Invention

The invention relates to an arrangement for compensating pressure in a housing, wherein at least one housing wall has a pressure compensation opening, which is closed with a semi permeable membrane, wherein the membrane is fixed, at least in a materially bonded way, on the housing wall.

An arrangement for closing pressure compensation openings is known from DE 197 08 116 C2. In particular, the pressure compensation openings are introduced into the housing of a motor vehicle control unit, for example, wherein the arrangement for closing pressure compensation openings is built up from at least two layers. In this case, it is envisaged that the arrangement is mounted on the housing surface
the second layer covers the pressure compensation openings and
is composed of a watertight and breathable material and
the first layer is removed at the points at which pressure compensation takes place, and the pressure compensation openings are covered only by the second layer.

Moreover, a housing for an electric circuit, in particular for a control unit for a vehicle, is described in DE 10 2006 053 115 A1. The housing is assigned a pressure compensation element, which has a semi permeable membrane communicating with the interior of the housing. The housing has at least one plastic region, on which a holding device for a device for protecting the membrane is directly arranged.

BRIEF SUMMARY OF THE INVENTION

It is the underlying object of the invention to indicate a better arrangement for compensating pressure in a housing than that in the prior art.

According to the invention, the object is achieved by the features indicated in the main claim.

Advantageous embodiments of the invention form the subject matter of the dependent claims.

In an arrangement for compensating pressure in a housing, at least one housing wall has a pressure compensation opening, which is closed with a semi permeable membrane, wherein the membrane is fixed, at least in a materially bonded way, on the housing wall. According to the invention, the housing wall has, in the region of the pressure compensation opening, an indentation and/or recess for receiving the membrane, the respective circumference thereof corresponding to a circumference of the membrane and the height thereof corresponding at least to the thickness of the membrane.

Through the arrangement of the membrane in the indentation and/or recess, the peripheral rim, in particular the peripheral punched edge of the membrane, is protected in a particularly advantageous way from mechanical damage, e.g. that caused by direct exposure to steam and/or a water jet. The membrane is arranged with a substantially accurate fit in the indentation and/or recess and fixed by means of materially bonded fixing and is thus protected especially from exposure to a directional jet, e.g. when the housing is being cleaned.

If the height of the indentation and/or recess corresponds to the thickness of the membrane, the membrane is arranged in the indentation and/or recess with its surface flush.

By way of example, the housing can be a housing for a control unit of a vehicle installed in the wet zone of the vehicle, e.g. in the engine compartment. The membrane closes the pressure compensation opening in the housing, wherein the membrane is arranged so as to compensate mechanical and/or thermal stresses acting on seals and/or joints of the housing owing to temperature and/or pressure fluctuations. For this purpose, the membrane is made semi permeable. Thus, on the one hand, the membrane is, in particular, permeable to air while, on the other hand, water and dirt, for example, cannot pass through the membrane into the housing from outside.

The specified solution for protecting the membrane, in particular for protecting the rim thereof from unintentional detachment, is a comparatively low-cost solution and protecting the rim increases reliability for the operation of the equipment arranged in the housing. The possibility that the membrane will come away from the housing wall and thereby expose the pressure compensation opening, allowing water, for example, to enter the housing, followed by corrosion of the housing from the inside and/or damage to the equipment in the housing, is very largely excluded.

In a preferred embodiment, the height of the indentation and/or recess corresponds to at least twice the thickness of the membrane, with the result that the membrane is arranged in a recessed manner in the indentation and/or recess. Thus, the membrane, in particular the rim thereof, is protected from exposure to a directional jet, thus making possible a further improvement in protection against detachment of the membrane due to water penetration.

In an advantageous way, the indentation and/or recess is formed externally on the housing wall, making the membrane accessible from the outside and, to the extent that the membrane is subjected to water, very largely excluding the possibility of the membrane coming away from the housing wall.

In an advantageous embodiment, the membrane is of self-adhesive design, eliminating the need to use adhesive to fix the membrane in a materially bonded way on the housing wall.

It is particularly advantageous if the membrane is designed to be self-adhesive, at least in the peripheral rim region, wherein the self-adhesive portion of the membrane corresponds to the region of the indentation and/or recess which adjoins the pressure compensation opening. In this case, the design of the self-adhesive portion of the membrane depends on the shape of the indentation and/or recess.

As described above, a protective element is arranged on the pressure compensation opening closed by means of the membrane, said protective element preferably being a self-adhesive protective sticker having ventilation openings. A protective element designed in this way is particularly simple to install and ensures that the membrane is reliably protected from mechanical damage.

In another preferred embodiment, the housing wall has a further indentation and/or recess for the arrangement of the protective element, the dimensions of said indentation or recess corresponding to the dimensions of the protective element. Thus, the surface of the protective element in the form of the protective sticker ends flush with the outer side of the housing wall. In this case, the indentation and/or recess on the one hand forms an aid to the alignment and fixing of the protective sticker on the housing wall. On the other hand, the fact that the protective element is likewise arranged in the further indentation and/or recess and that the surface of the protective sticker as a protective element preferably ends flush with the housing wall means that the protective sticker too, in particular the rim region thereof, is protected when exposed to an excessive directional jet, thus counteracting unwanted detachment of the protective sticker from the housing wall in this case too.

The indentation and/or recess for the membrane is preferably formed within the further indentation and/or recess for the protective element, ensuring that the protective element covers and thus protects the membrane. In this case, the protective element is likewise arranged from the outside on the housing wall and the surface of said protective element ends flush with the housing wall. In this case, the indentations and/or the recesses are designed in such a way that the protective element in the form of the protective sticker is spaced apart sufficiently from the membrane, allowing at least an air flow between the membrane and the protective sticker to be achieved.

As a particularly preferred option, the further indentation and/or recess has at least one channel-shaped depression.

In another embodiment, the at least one ventilation opening in the protective sticker is arranged in the region of the at least one channel-shaped depression in the state of the protective sticker in which it is arranged on the housing wall.

The at least one ventilation opening in the protective sticker and the at least one channel-shaped depression in the further indentation and/or recess are used for controlled air conduction, especially during a pressure reduction in the housing achieved by means of the membrane. The air is guided by the membrane by means of the depression, and the air can escape into the environment through the ventilation opening.

In one possible design of the arrangement for pressure compensation, the indentations and/or recesses and/or the channel-shaped depressions are stamped, punched and/or milled into the housing wall. This makes it possible to form and shape the respective indentation and/or recess in a manner corresponding to a forming tool which is used.

By means of a pressure compensating arrangement of this kind, a solution for arranging and protecting the membrane which is optimized for the installation space is specified.

Illustrative embodiments of the invention are explained in detail below by means of drawings.

DESCRIPTION OF THE INVENTION

In all the figures, parts which correspond to one another are provided with the same reference signs.

Figure 1:
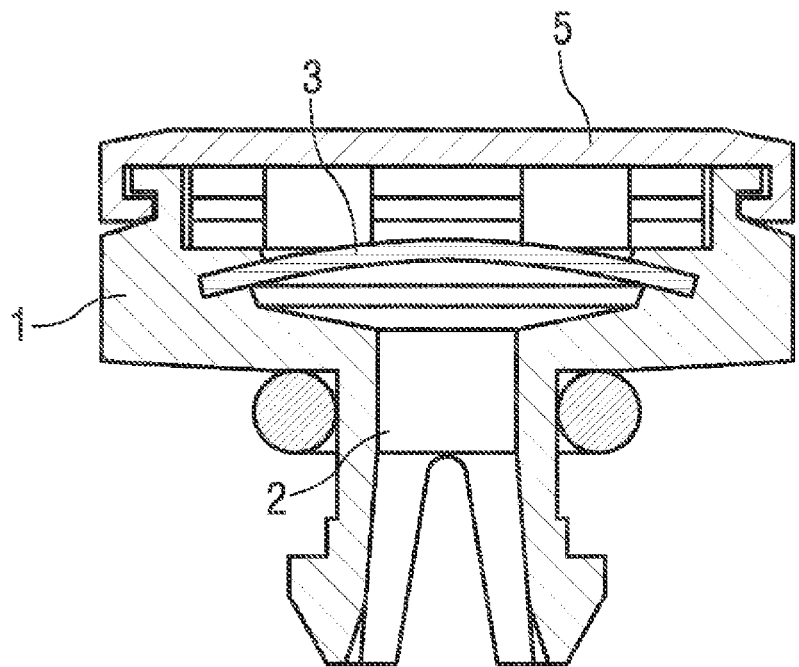
FIG. 1 shows a schematic section through a mechanically enclosed membrane for compensating pressure in a housing in accordance with the prior art.

FIG. 1 shows a section through a housing wall 1 of a housing (not shown in greater detail) having a pressure compensation opening 2, which is closed with a membrane 3 according to the prior art. The membrane 3 is protected by means of a protective element 5, which is part of the housing, in particular of the housing wall 1. A prefabricated, mechanically enclosed and thus protected membrane 3 of this kind can be embodied in various ways and can also be obtained commercially at relatively high cost as an assembly, wherein a protective element 5 of this kind requires additional installation space, and sealing surfaces must be formed in an appropriate manner at least in the region of the positive joint between the housing wall 1 and the protective element 5. In this embodiment, the membrane 3 is integrated positively into the housing wall 1.

Figure 2:
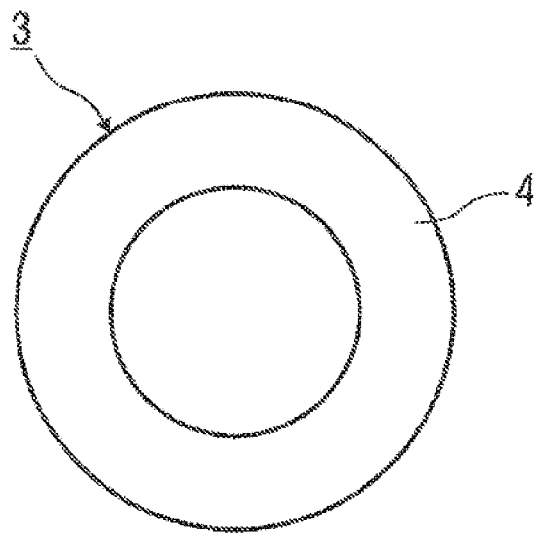
FIG. 2 shows a schematic plan view of a membrane.
Figure 3:
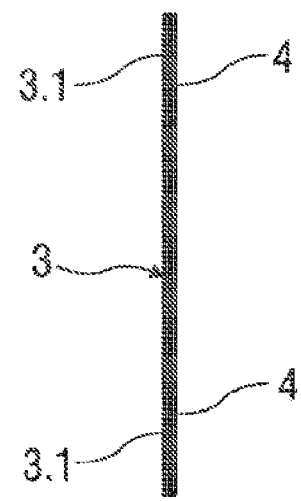
FIG. 3 shows a schematic first section through the membrane.
Figure 4:
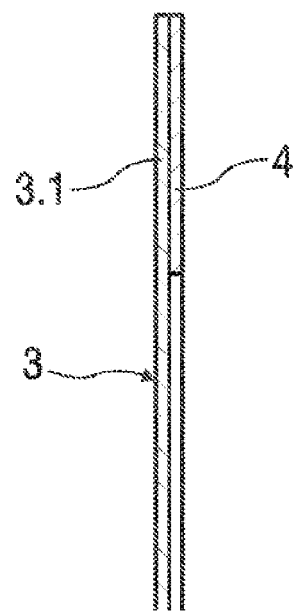
FIG. 4 shows a schematic second section through the membrane.

FIGS. 2 to 4 show a membrane 3 for closing a pressure compensation opening 2 in a housing wall 1. The membrane 3 is of semipermeable design, thus allowing air especially to flow through the membrane 3, whereas it is not possible for moisture, e.g. in the form of water, to pass through the membrane 3. Here, FIG. 2 shows a plan view, FIG. 3 shows a sectional representation and FIG. 4 shows a detail of the sectional representation of the membrane 3.

The housing, the at least one housing wall 1 of which has the pressure compensation opening 2, is, in particular, a housing for a control unit, which is very sensitive to moisture. For example, the control unit is embodied as an engine control unit and is arranged in an engine compartment of a vehicle, i.e. in a wet zone thereof. In order to be able substantially to exclude the possibility that the housing will be deformed for the pressure compensation resulting, in particular, from temperature fluctuations, and will thereby be damaged, and/or that sealing elements of the housing will fail to work, the pressure compensation opening 2 is provided. Via the pressure compensation opening 2, pressure compensation can be performed, there being the risk in this case that moisture will enter the housing via the pressure compensation opening 2, giving rise to the risk of corrosion and/or damage to the control unit. To counteract this risk, the pressure compensation opening 2 in the housing is closed with the semi permeable membrane 3. The pressure compensation can take place without the possibility of moisture penetrating into the housing via the pressure compensation opening 2 in the housing wall 1.

The membrane 3 is of circular design and is embodied so as to be self-adhesive, and therefore there is no need of any further aids to fix the membrane 3 on the housing wall 1 in order to close the pressure compensation opening 2. In comparison with the membrane 3 shown in FIG. 1, the self-adhesive membrane 3 is relatively inexpensive. Here, the self-adhesive membrane 3 consists of the membrane 3 itself and of a double-sided adhesive film 4 fixed thereon, thereby making the membrane 3 self-adhesive.

The region in which the membrane 3 is made self-adhesive by means of the film 4 extends in a ring shape over a rim region 3.1 of the membrane 3, as FIGS. 3 and 4 show in detail.

The membrane 3 and the adhesive film 4 are generally punched out or cut out from a substrate material in one operation and are generally wound onto a roll. Such a delivery form allows highly automated assembly in a production environment to give the arrangement of the membrane 3.

One significant disadvantage of the self-adhesive membrane 3, which can be fixed externally on the housing wall 1, is especially the fact that the membrane 3 is not protected from mechanical damage and/or from moisture, e.g. from a jet of steam and/or water.

Figure 5:
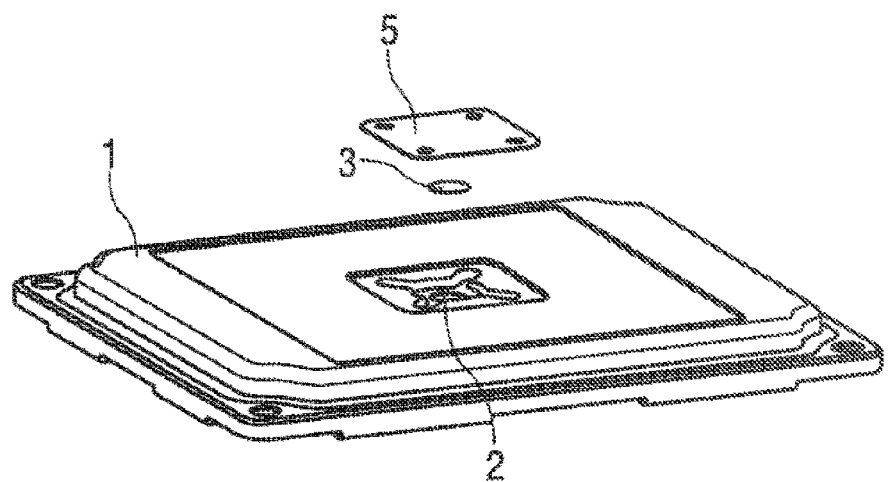
FIG. 5 shows a schematic exploded representation of a housing wall with a membrane and a protective element in a perspective view.

A perspective view of an exploded representation of a housing wall 1 with a pressure compensation opening 2, a membrane 3 and a protective element 5 in the form of a protective sticker is shown in FIG. 5.

To protect the membrane 3 from mechanical damage and/or from moisture, the protective element 5 is provided, which can be arranged on the housing wall 1 over the membrane 3, with a spacing relative to the latter. In particular, the protective sticker is stuck to the housing wall 1 as a protective element 5. On the one hand, the protective element 5 in the form of the protective sticker reduces the risk of mechanical damage to the membrane 3 and, on the other hand, the membrane 3 is protected from direct exposure to a directional jet by virtue of the reduction in the hydraulic pressure by means of the protective element 5. For example, the housing is exposed to a directional jet for cleaning.

Figure 7:
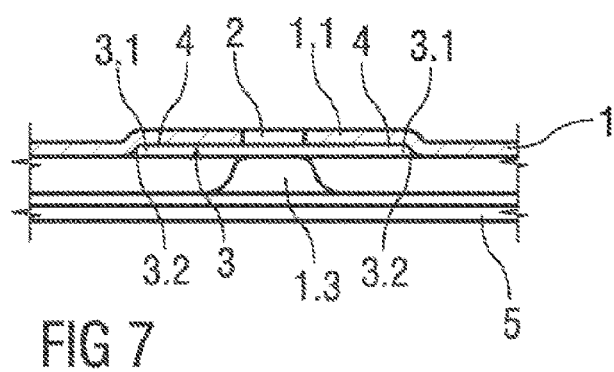
FIG. 7 shows a schematic section through a detail of the membrane arranged in the region and of the protective element.
Figure 8:
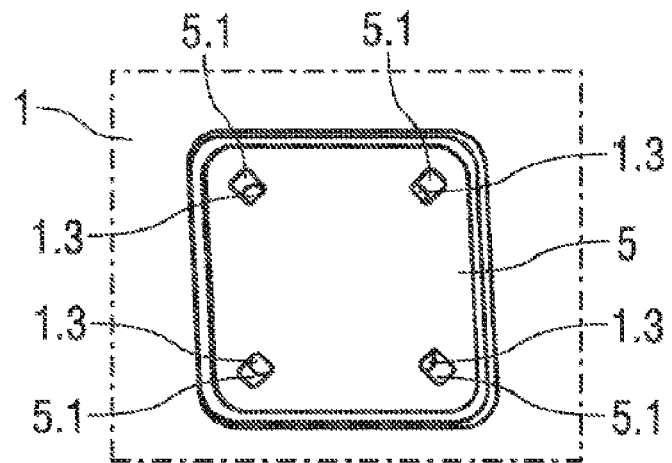
FIG. 8 shows schematically the region with the membrane covered by means of the protective element.
Figure 9:
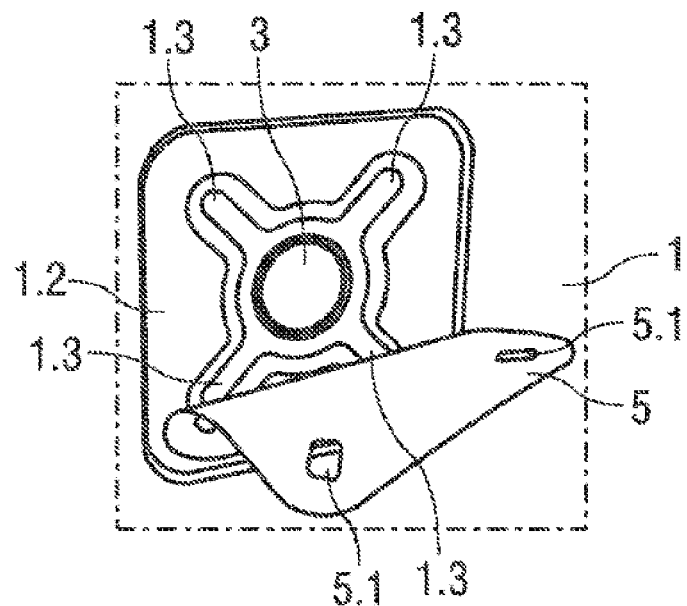
FIG. 9 shows schematically the region with a partially detached protective element.

The arrangement and design of the protective element 5 in the form of the protective sticker are illustrated in greater detail in FIGS. 7, 8 and 9.

Figure 6:
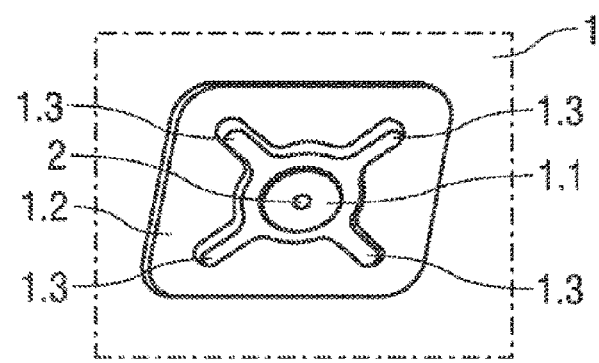
FIG. 6 shows schematically a region of the housing wall in which the membrane and the protective element can be arranged.

FIG. 6 shows an enlarged detail of the region of the housing wall 1 in which the pressure compensation opening 2 is formed.

The housing wall 1 has an indentation and/or recess 1.1, in the center of which the pressure compensation opening 2 is located. The indentation and/or recess 1.1 has a circular shape, wherein the membrane 3 can be arranged in the indentation and/or recess 1.1 in the housing wall 1. Here, the indentation and/or recess 1.1 is introduced into the housing wall 1 from the outside, with the result that the depression formed by means of the indentation and/or recess 1.1 is formed in such a way as to be directed toward a housing interior.

By way of example, the indentation and/or recess 1.1 is introduced into the housing wall 1 by means of stamping, punching and/or milling and/or by means of some other suitable forming method.

The membrane 3 can be arranged in the indentation and/or recess 1.1, wherein, in respect of its circumference, the membrane 3 has dimensions corresponding to the dimensions of the circumference of the indentation and/or recess 1.1 or vice versa. The indentation and/or recess 1.1 is provided for arrangement of the membrane 3 to close the pressure compensation opening 2, wherein the indentation and/or recess 1.1 has a depth which corresponds at least to the thickness, preferably to twice the thickness, of the membrane 3. As a result, the membrane 3 is arranged completely in the indentation and/or recess 1.1, as shown in greater detail in the sectional representation in FIG. 7. If the depth of the indentation and/or recess 1.1 corresponds only to the thickness of the membrane 3, the surface of the membrane 3 ends flush with the housing wall 1 in the arranged state. As a particularly preferred option, the indentation and/or recess 1.1 and the membrane 3 are designed in such a way that the membrane 3 can be arranged with positive engagement in the indentation and/or recess 1.1 and can be fixed in a materially bonded way.

Since the membrane 3 is arranged in the indentation and/or recess 1.1, a rim 3.2, i.e. an edge, in particular a punched edge, of the membrane 3 is not arranged in the indentation and/or recess 1.1 in a freely accessible manner but is arranged in a protected manner therein. Damage to the membrane 3 due to exposure to a directional jet, e.g. by means of steam and/or water, can thus be very largely excluded.

For arrangement of the protective sticker as a protective element 5, the housing wall 1 furthermore has a further indentation and/or recess 1.2, within which the indentation and/or recess 1.1 for the membrane 3 is arranged.

The further indentation and/or recess 1.2 has outside dimensions which correspond to dimensions of the protective element 5, in particular to the outer contour thereof. Moreover, the further indentation and/or recess 1.2 comprises four channel-shaped depressions 1.3, which are arranged and formed substantially in a cross shape around the indentation and/or recess 1.1 of the membrane 3. In this case, a spacing can be established between the protective element 5 in the form of the protective sticker and the membrane 3 by means of the depth of the channel-shaped depressions 1.3 if the depth of the indentation and/or recess 1.1 for the membrane 3 corresponds merely to the thickness thereof. Here, a spacing between the protective element 5 and the membrane 3 is very largely a matter of free choice.

As described above, a detail of a sectional representation of the region of the pressure compensation opening 2 in the housing wall 1 with the membrane 3 fixed and the protective element 5 fixed is shown in FIG. 7. In the illustrative embodiment under consideration, which is shown in FIG. 7, the depth of the indentation and/or recess 1.1 corresponds to the thickness of the membrane 3, and therefore the surface of the membrane 3 ends flush with the housing wall 1 in the region of the channel-shaped depressions 1.3.

In each of its corner regions, the protective element 5 has a ventilation opening 5.1, as shown in greater detail in FIGS. 8 and 9. Here, the respective ventilation opening 5.1 is arranged in the region of a channel-shaped depression 1.3 in the further indentation and/or recess 1.1 when the protective element 5 is fixed on the housing wall 1. A respective channel-shaped depression 1.3 is thus connected in terms of flow to a ventilation opening 5.1 in the protective element 5, i.e. in the protective sticker, thus ensuring that air flowing out of the housing via the membrane 3, in particular, is guided to the ventilation openings 5.1 by means of the channel-shaped depressions 1.3 and can flow through these into the environment of the housing. FIG. 8 shows the protective element 5 in the form of the protective sticker, which is arranged in the further indentation and/or recess 1.2, while the protective element 5 is shown in a state partially detached from the housing wall 1 in FIG. 9. Moreover, the membrane 3 closes the pressure compensation opening 2.

A shape of the ventilation openings 5.1 and of the protective element 5 is very largely a matter of free choice, these preferably being arranged and formed with a predetermined spacing with respect to the membrane 3.

Owing to the ventilation openings 5.1, there is the risk that a directional jet of, for example, steam and/or water will get between the protective element 5 and the membrane 3, but the positively engaged arrangement of the membrane 3 in the indentation and/or recess 1.1 very largely excludes penetration of moisture and hence the risk of detachment of the membrane 3 from the film 4 and consequent exposure of the pressure compensation opening 2 is at least reduced.

LIST OF REFERENCE SIGNS

1 housing wall
1.1 indentation/recess
1.2 further indentation/recess
1.3 channel-shaped depression
2 pressure compensation opening
3 membrane
3.1 rim region
3.2 rim
4 film
5 protective element
5.1 ventilation opening

The invention claimed is:

1. A configuration for compensating for pressure in a housing, the configuration comprising:
   at least one housing wall with a pressure compensation opening formed therein;
   a semi-permeable membrane closing said pressure compensation opening and having a circumference and a thickness, said semi-permeable membrane being fixed, at least in a materially bonded way, on said housing wall;
   a protective element covering said semi-permeable membrane; and
   said housing wall having in a region of said pressure compensation opening, an indentation and/or recess formed therein, said indentation and/or recess receiving said semi-permeable membrane, said indentation and/or recess having a given circumference corresponding to said circumference of said semi-permeable membrane and a height corresponding at least to said thickness of said semi-permeable membrane;
   said protective element being a self-adhesive protective sticker having at least one ventilation opening formed therein;
   said protective element arranged on said housing wall and spaced away from said semi-permeable membrane;
   said housing wall having an additional indentation and/or recess formed therein for receiving said protective element, dimensions of said additional indentation and/or recess corresponding to dimensions of said protective element;
   said additional indentation and/or recess having at least one channel-shaped depression; and
   wherein said at least one ventilation opening in said self-adhesive protective sticker is disposed in a region of said at least one channel-shaped depression in a state of said self-adhesive protective sticker in which it is disposed on said housing wall.

2. A configuration for compensating for pressure in a housing, the configuration comprising:
   at least one housing wall with a pressure compensation opening formed therein;
   a semi-permeable membrane closing said pressure compensation opening and having a circumference and a thickness, said semi-permeable membrane being fixed, at least in a materially bonded way, on said housing wall;
   a protective element covering said semi-permeable membrane; and
   said housing wall having in a region of said pressure compensation opening, an indentation and/or recess formed therein, said indentation and/or recess receiving said semi-permeable membrane, said indentation and/or recess having a given circumference corresponding to said circumference of said semi-permeable membrane and a height corresponding at least to said thickness of said semi-permeable membrane;
   said protective element being a self-adhesive protective sticker having at least one ventilation opening formed therein; and
   said protective element arranged on said housing wall and spaced away from said semi-permeable membrane;
   wherein said height of said recess is equal to said thickness of said semi-permeable membrane.

3. The configuration according to claim 2, wherein said indentation and/or recess for receiving said semi-permeable membrane is formed on an outer side of said housing wall.

4. The configuration according to claim 2, wherein said semi-permeable membrane is configured to be self-adhesive, at least in a peripheral rim region.

5. The configuration according to claim 2, wherein said housing wall has an additional indentation and/or recess formed therein for receiving said protective element, dimensions of said additional indentation and/or recess corresponding to dimensions of said protective element.

6. The configuration according to claim 5, wherein said indentation and/or recess for said semi-permeable membrane is formed within said additional indentation and/or recess for said protective element.

7. The configuration according to claim 5, wherein said additional indentation and/or recess has at least one channel-shaped depression.

8. The configuration according to claim 7, wherein said indentation and/or recess, said additional indentation and/or recess and/or said channel-shaped depressions are stamped, punched and/or milled into said housing wall.

9. The configuration according to claim 2, wherein said at least one ventilation opening in said self-adhesive protective sticker is disposed in a region of said at least one channel-shaped depression in a state of said self-adhesive protective sticker in which it is disposed on said housing wall.

* * * * *